(12) United States Patent
Jang et al.

(10) Patent No.: US 11,499,232 B2
(45) Date of Patent: Nov. 15, 2022

(54) DEPOSITION APPARATUS AND DEPOSITION METHOD USING THE SAME (71) Applicant: Samsung Display Co., Ltd., Yongin-si (KR)

(72) Inventors: Choelmin Jang, Yongin-si (KR); Sunghun Key, Yongin-si (KR); Junggon Kim, Yongin-si (KR); Myungsoo Huh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/122,755

(22) Filed: Sep. 5, 2018

(65) Prior Publication Data
US 2019/0203359 A1 Jul. 4, 2019

(30) Foreign Application Priority Data

Dec. 28, 2017 (KR) .................. 10-2017-0182639

(51) Int. Cl.
C23C 16/54 (2006.01)
C23C 16/455 (2006.01)
H01J 37/32 (2006.01)

(52) U.S. Cl.
CPC ........ *C23C 16/54* (2013.01); *C23C 16/45519* (2013.01); *H01J 37/3244* (2013.01); *C23C 16/45544* (2013.01)

(58) Field of Classification Search
CPC .............. C23C 16/54; C23C 16/45519; C23C 16/45551; C23C 16/402
See application file for complete search history.

(56) References Cited

U.S. PATENT DOCUMENTS

| 8,398,770 B2 | 3/2013 | Levy et al. |
| 8,944,077 B2 | 2/2015 | Kato et al. |
| 2003/0113451 A1* | 6/2003 | Mayer ................... C23C 16/045 427/255.28 |
| 2004/0007468 A1* | 1/2004 | Cohen ................. B81C 1/00476 205/118 |
| 2004/0126493 A1* | 7/2004 | Shimizu ............ H01J 37/32532 427/255.28 |
| 2004/0231595 A1* | 11/2004 | Takeuchi ................ C23C 14/28 118/721 |
| 2008/0020146 A1 | 1/2008 | Choi et al. |

(Continued)

FOREIGN PATENT DOCUMENTS

| CN | 101809193 | 8/2010 |
| CN | 104488067 | 4/2015 |

(Continued)

*Primary Examiner* — Joseph A Miller, Jr.
(74) *Attorney, Agent, or Firm* — H.C. Park & Associates, PLC (57) ABSTRACT A deposition apparatus and method of deposition are provided. The deposition apparatus includes a gas supply unit, including: a first process gas supply unit blowing a first process gas onto a deposition-target surface; a second process gas supply unit blowing a second process gas different from the first process gas onto the deposition-target surface of the substrate; and air curtain units blocking an area between an area where the process gas is blown and an area where the second process gas is blown, by blowing an inert gas.

3 Claims, 7 Drawing Sheets (56) References Cited

U.S. PATENT DOCUMENTS

| | | | |
|---|---|---|---|
| 2008/0210064 A1* | 9/2008 | Mikus | C23C 30/005 82/1.11 |
| 2009/0078204 A1 | 3/2009 | Kerr et al. | |
| 2009/0165715 A1* | 7/2009 | Oh | C23C 16/45551 118/724 |
| 2010/0159792 A1 | 6/2010 | Visser et al. | |
| 2011/0146575 A1 | 6/2011 | Choi et al. | |
| 2012/0098146 A1* | 4/2012 | Lee | H01L 23/3192 118/721 |
| 2012/0225192 A1* | 9/2012 | Yudovsky | C23C 16/45551 427/58 |
| 2013/0115373 A1* | 5/2013 | Kim | C23C 16/458 427/255.5 |
| 2015/0101535 A1 | 4/2015 | Lee et al. | |
| 2015/0184295 A1 | 7/2015 | Jeong | |
| 2015/0299855 A1* | 10/2015 | Yudovsky | C23C 16/52 427/8 |
| 2015/0376786 A1* | 12/2015 | Yudovsky | C23C 16/455 118/730 |
| 2016/0333478 A1 | 11/2016 | Tatsuoka et al. | |
| 2017/0211177 A1 | 7/2017 | Kon | |
| 2017/0233868 A1* | 8/2017 | Donoso | C23C 16/4412 438/778 |
| 2017/0263875 A1 | 9/2017 | Kim | |
| 2017/0362706 A1* | 12/2017 | Soininen | C23C 16/45529 |

FOREIGN PATENT DOCUMENTS

| | | |
|---|---|---|
| CN | 104561935 | 4/2015 |
| CN | 105051251 | 11/2015 |
| CN | 106795623 | 5/2017 |
| CN | 107406980 | 11/2017 |
| JP | 2010153805 | 7/2010 |
| JP | 2015131984 | 7/2015 |
| KR | 10-2011-0072092 | 6/2011 |
| KR | 10-2014-0137130 | 12/2014 |
| KR | 10-2016-0005876 | 1/2016 |
| KR | 10-2016-0065071 | 6/2016 |
| KR | 10-2016-0142059 | 12/2016 |
| KR | 10-1721931 | 4/2017 |
| WO | 2017057871 | 4/2017 |

\* cited by examiner

DEPOSITION APPARATUS AND DEPOSITION METHOD USING THE SAME

CROSS-REFERENCE TO RELATED APPLICATION

This application claims priority from and the benefit of Korean Patent Application No. 10-2017-0182639, filed on Dec. 28, 2017, which is hereby incorporated by reference for all purposes as if fully set forth herein.

BACKGROUND

Field

Exemplary embodiments of the invention relate generally to a deposition apparatus used for performing deposition to form thin films by supplying a process gas onto a surface of an object and a method of deposition using the same.

Discussion of the Background

In processes of manufacturing thin films, such as forming thin films used in organic light emitting displays, a chemical vapor deposition (CVD) process is frequently used for forming thin films by supplying a process gas onto a surface of an object in a deposition chamber. That is, by putting a mask on a substrate and supplying the process gas thereon, thin films formed due to chemical reactions are deposited on the substrate, according to an opening pattern of the mask. A plasma enhanced chemical vapor deposition (PECVD) process, which is a process of depositing a process gas to be converted to plasma by applying a high voltage to a gas supply unit while supplying the process gas to between the substrate and the gas supply unit, and an atomic layer deposition (ALD) process, which is a process of depositing a process gas to be extremely thin, for example, as thin as an atomic layer, are also widely used.

The above information disclosed in this Background section is only for understanding of the background of the inventive concepts, and, therefore, it may contain information that does not constitute prior art.

SUMMARY

In various deposition processes as described above, cases in which only one kind of thin film is formed are not very common, and in general, a plurality of thin film layers are formed as a multilayer stack. Accordingly, to form thin film layers as a multilayer stack, in the related art, a deposition process has typically been performed in a method including: preparing a plurality of chambers; depositing a thin film layer on a substrate in one of the chambers; and forming a next thin film layer by transferring the substrate to a next chamber, or has been performed in a method including: depositing a thin film layer in a chamber; completely exhausting a process gas; and forming a next thin film layer by injecting a next process gas into the chamber. However, when a deposition process is performed in the aforementioned methods, whether the substrate is transferred to several chambers during the process or the process gas is consecutively changed in one same chamber, a working standby time between operations greatly increases, while productivity significantly decreases, and as the substrate is frequently transferred, the risk of breakage during the process may also increase.

One or more exemplary embodiments of the invention include a deposition apparatus for forming different kinds of deposition films by using one same process in one same chamber and a method of deposition using the same.

Additional features of the inventive concepts will be set forth in the description which follows, and in part will be apparent from the description, or may be learned by practice of the inventive concepts.

According to one or more exemplary embodiments, a deposition apparatus includes a deposition chamber, a susceptor supporting a substrate in the deposition chamber, a gas supply unit supplying process gas to the substrate, wherein the gas supply unit includes: a first process gas supply unit blowing first process gas to a deposition-target surface; a second process gas supply unit blowing second process gas different from the first process gas to the deposition-target surface of the substrate; and air curtain units blocking an area between an area to which the first process gas is blown and an area to which the second process gas is blown, by blowing inert gas.

The gas supply unit may further include a first exhaust unit configured to form a circulation path for the first process gas between the deposition-target surface of the substrate and the first process gas supply unit by withdrawing the first process gas, and a second exhaust unit configured to form a circulation path for the second process gas between the deposition-target surface of the substrate and the second process gas supply unit by withdrawing the second process gas.

A distance between the gas supply unit and the deposition-target surface of the substrate may be in a range of from 1.5 mm to 4 mm.

The susceptor may perform a reciprocating motion in the deposition chamber, having the gas supply unit as a center.

The deposition chamber may be provided with extra areas sufficient for the deposition-target surface of the substrate to pass the entire area in which the first process gas supply unit and the second process gas supply unit are included.

The first process gas may include a mixture forming a nitride film on the deposition-target surface of the substrate, and the second process gas may include a mixture forming an oxide film on the deposition-target surface of the substrate.

The first process gas may include a mixture forming an inorganic layer on the substrate, and the second process gas may include a mixture forming an organic layer on the substrate.

The first process gas may include an atomic layer reaction source to be absorbed by the substrate, and the second process gas may include atomic layer reaction gas to occur a film-formation reaction with the absorbed reaction source.

The inert gas may also purge extra reaction source overlaid on and absorbed by an atomic layer formed by the film forming reaction.

The first process gas may include source to form a film on the substrate, and the second process gas may include surface treatment gas to reform the thin film formed by the first process gas.

According to one or more exemplary embodiments, a method of deposition includes: preparing, in a deposition chamber, a first process gas supply unit blowing first process gas on a deposition-target surface, a second process gas supply unit blowing second process gas, which is different from the first process gas, on the deposition-target surface of the substrate, and air curtain units blocking an area between an area where the first process gas is blown and an area where the second process gas is blown, by blowing inert gas;

forming a thin film layer made of the first process gas and a thin film layer made of the second process gas on the deposition-target surface of the substrate, by blowing the first process gas and the second process gas toward the substrate.

The method may further include: forming a circulation path for the first process gas between the surface of the substrate and the first process gas supply unit, by withdrawing the first process gas to a first exhaust unit provided in the gas supply unit; forming a circulation path for the second process gas between the surface of the substrate and the second process gas supply unit, by withdrawing the second process gas to a second exhaust unit provided in the gas supply unit.

A distance between the gas supply unit and the deposition-target substrate of the surface may be maintained to be in a range of from 1.5 mm to 4 mm.

While the first process gas and the second process gas are being blown, the substrate may be moved to perform a reciprocating motion, having the gas supply unit as a center.

When the substrate moves from one side to another side having the gas supply unit as a center, the deposition-target surface of the substrate may pass through the entire area including the first process gas supply unit and the second process gas supply unit.

The first process gas may include a mixture forming a nitride film on the deposition-target surface of the substrate, and the second process gas may include a mixture forming an oxide film on the deposition-target surface of the substrate.

The first process gas may include a mixture forming an inorganic layer on the substrate, and the second process gas may include a mixture forming an organic layer on the substrate.

The first process gas may include an atomic layer reaction source to be absorbed by the substrate, and the second process may include atomic layer reaction gas to cause a film-forming reaction with the absorbed reaction source.

The inert gas may also purge extra reaction source overlaid on and absorbed by an atomic layer formed by the film-forming reaction.

The first process gas may include a source to form a film on the substrate, and the second process gas may include surface treatment gas to reform a thin film made of the first process gas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
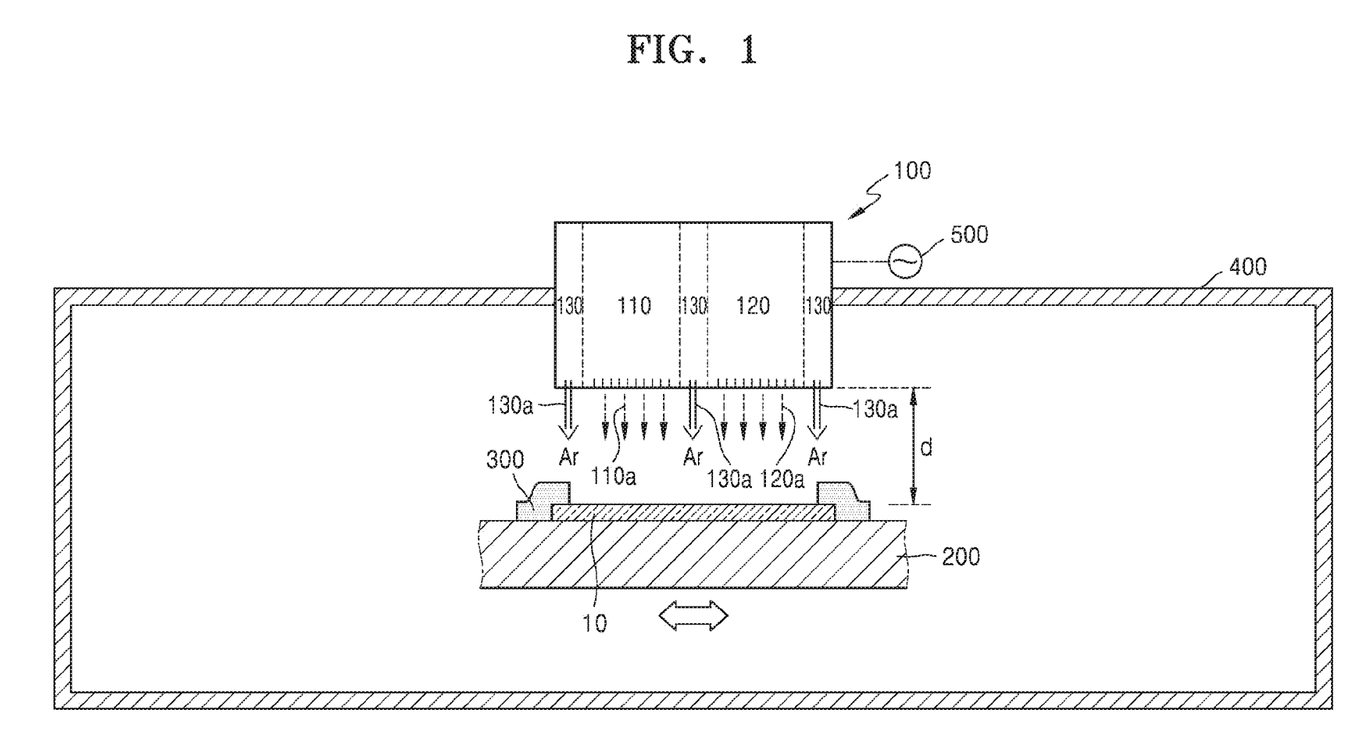
FIG. 1 is a cross-sectional view schematically showing a structure of a deposition apparatus according to an exemplary embodiment.
Figure 2:
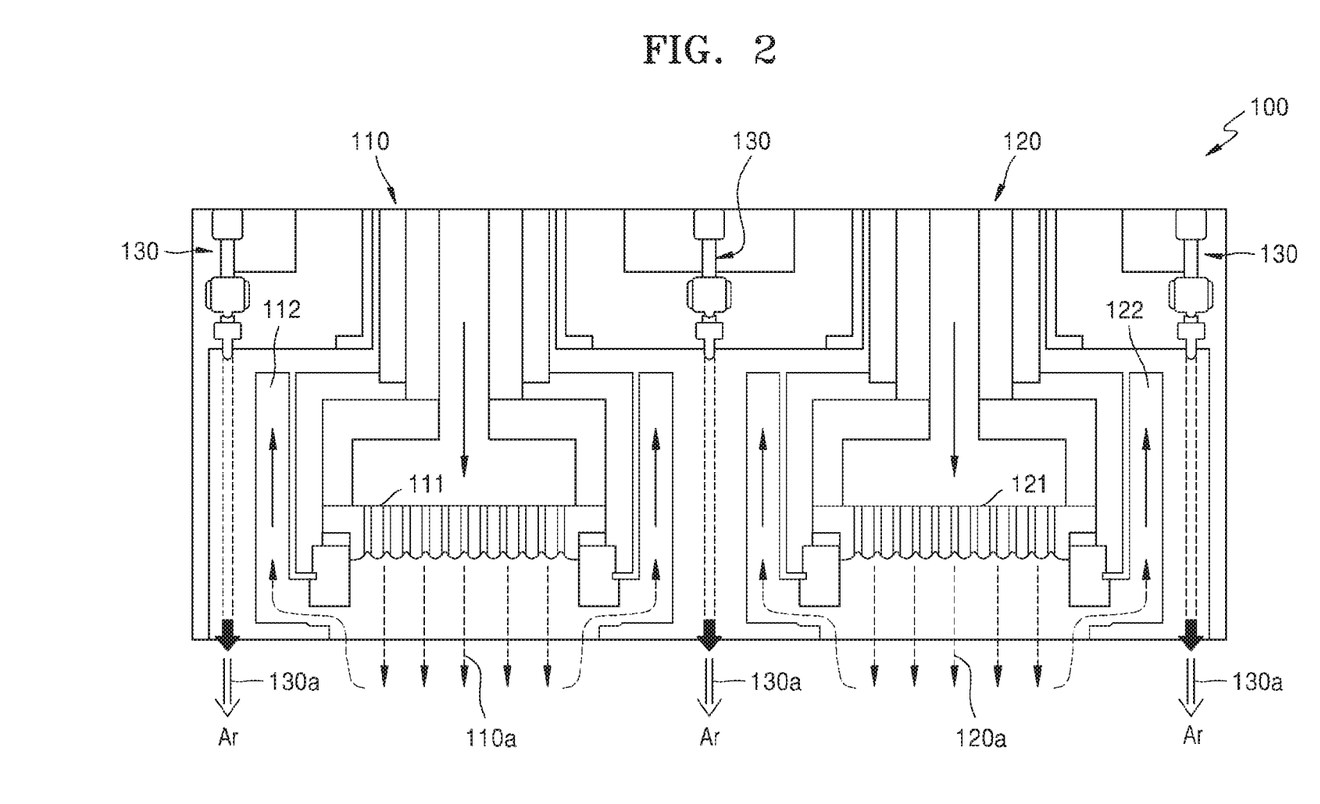
FIG. 2 is a cross-sectional view showing an inner structure of a gas supply unit in the deposition apparatus shown in FIG. 1.

FIG. 1 schematically shows a structure of a deposition apparatus according to an exemplary embodiment, and FIG. 2 particularly shows an inner structure of a gas supply unit 100 in the deposition apparatus shown in FIG. 1.

As illustrated in FIG. 1, the deposition apparatus according to an exemplary embodiment includes a susceptor 200 supporting a substrate 10 in a deposition chamber 400, a mask 300 provided with an opening to define a deposition area such that a targeted deposition film is formed on the substrate 10, and a gas supply unit 100 supplying the process gas to the substrate 10. Therefore, when the gas supply unit 100 blows process gas toward a deposition-target surface of the substrate 10, which is opened by the mask 300, a thin film layer made of the process gas is formed. Reference number 500 denotes a radio frequency (RF) power. A deposition process, where deposition is performed while injecting process gas into an area between the substrate 10 and the gas supply unit 100 in a state where the RF power is off, is a chemical vapor deposition (CVD) process, and a deposition process, which is performed to form plasma between the substrate 10 and the gas supply unit 100 by applying a high voltage to the gas supply unit 100 by the RF power 500, is a plasma enhanced chemical vapor deposition (PECVD) process. In other words, the deposition apparatus described in the exemplary embodiment may be applied to deposition processes regardless of types of the processes, and may, for example, be applied to an atomic layer deposition (ALD) process. Applying the deposition apparatus to various deposition processes will be described again later.

The gas supply unit 100 includes a first process gas supply unit 110 blowing a first process gas 110a, a second process gas supply unit 120 blowing a second process gas 120a, and air curtain units 130 blowing inert gas, such as argon, to prevent the first and second process gases 110a and 120a from being spread around and mixed. In other words, the gas supply unit 100 simultaneously supplies the first process gas 110a and the second process gas 120a different from the first process gas 110a, instead of supplying only one kind of process gas to the substrate 10, such that different types of thin film layers are formed in one same process, and makes barriers using the air curtain units 130 blowing inert gas 130a to prevent the first and second process gases 110a and 120a from being mixed.

The susceptor 200 loaded with the substrate 10 may perform a reciprocating motion having the gas supply unit 100 as a center in the deposition chamber 400, and extra areas, which are sufficient for the entire deposition-target surface of the substrate 10 to pass the areas to which the first and the second process gases 110a and 120a are blown, are respectively secured in the left and right of an inner area of the deposition chamber 400.

In this case, a distance d between the gas supply unit 100 and the surface of the substrate 10 may be maintained to be as narrow as from 1.5 mm to 4 mm such that the first and second process gases 110a and 120a form circulation paths for blow and exhaust and not be scattered around.

In this regard, referring to FIG. 2, a structure of the gas supply unit 100 is described in more detail.

As described above, the gas supply unit 100 includes the first process gas supply unit 110 including a first nozzle 111 blowing the first process gas 110a and the second process gas supply unit 120 including a second nozzle 121 blowing the second process gas 120a, and the first and second process gases 110a and 120a are prevented from being mixed, due to inert gas 130a, such as argon, blown by the air curtain units 130 around areas to which the first and the second process gases 110a and 120a are respectively blown.

And a first exhaust unit 112 and a second exhaust unit 122, which absorb and discharge the first and second process gases 110a and 120a that are blown, are respectively provided right next to the first nozzle 111 and the second nozzle 121. Accordingly, circulation paths for blow and exhaust of the first process gas 110a and the second process gas 120a are respectively formed between the substrate 10 and the first process gas supply unit 110 and between the substrate and the second process gas supply unit 120, and to maintain the circulation paths to be in a stable state, gaps d between the circulation paths may be maintained to be as narrows as from 1.5 mm to 4 mm. Although the air curtain units 130, to a certain degree, prevent the first and second process gases 110a and 120a from being scattered, the circulation paths for blow and exhaust may be formed to more stably prevent the process gases from being mixed.

Before describing various method of deposition using the deposition apparatus having the aforementioned structure, as an example of an object in which thin film layers may be formed by using the deposition apparatus, an organic light emitting display will now be briefly described with reference to FIG. 4.

Figure 4:
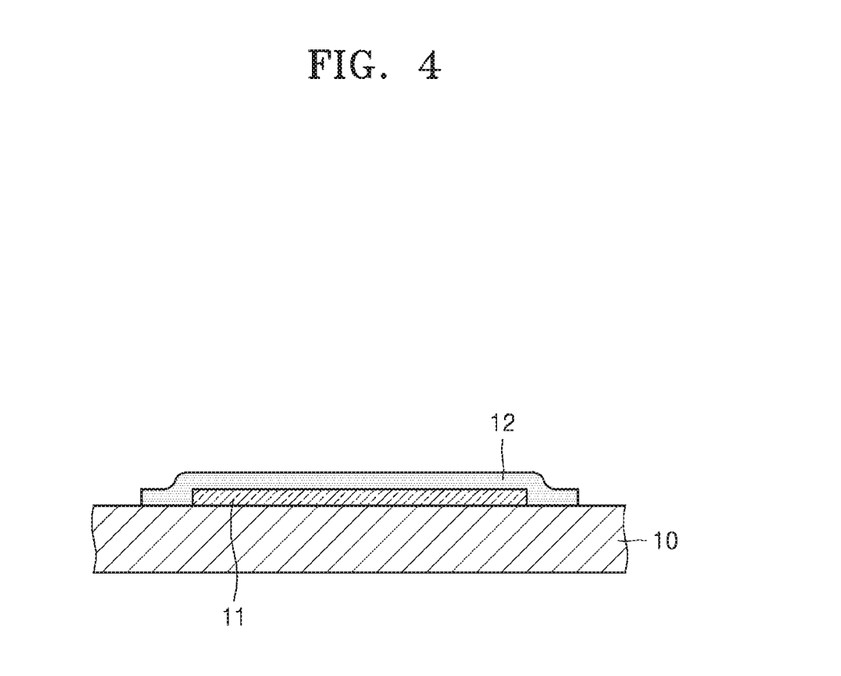
FIG. 4 is a cross-sectional view schematically illustrating a structure of an organic light emitting display, as an example of an object that may be manufactured by using the deposition apparatus shown in FIG. 1.

FIG. 4 shows an organic light emitting display including thin film encapsulation layers 12 that may be formed by using the aforementioned deposition apparatus.

Referring to FIG. 4, the organic light emitting display has a structure in which a display unit 11 implementing images are provided on the substrate 10, and the thin film encapsulation layers 12 are put on the display unit 11. Accordingly, the display unit 11 is sealed up between the substrate 10 and the thin film encapsulation layers 12, and the thin film encapsulation layers 12 protect the display unit 11 from moisture and air from outside.

The thin film encapsulation layers 12 may be formed by piling up a plurality of inorganic layers, and may also be made by alternatively piling up inorganic layers and organic layers. The inorganic layers mainly protect the thin film encapsulation layers 12 from moisture transmission, and the organic layers flatten curves of lower layers with fluidity, and simultaneously, give flexibility to the thin film encapsulation layers 12.

Therefore, when forming the thin film encapsulation layers 12 by piling up different kinds of inorganic layers or by piling up inorganic layers and organic layers, the aforementioned deposition apparatus may be used.

Referring to FIGS. 3A through 3D, a deposition process using the deposition apparatus will be described.

Figure 3A:
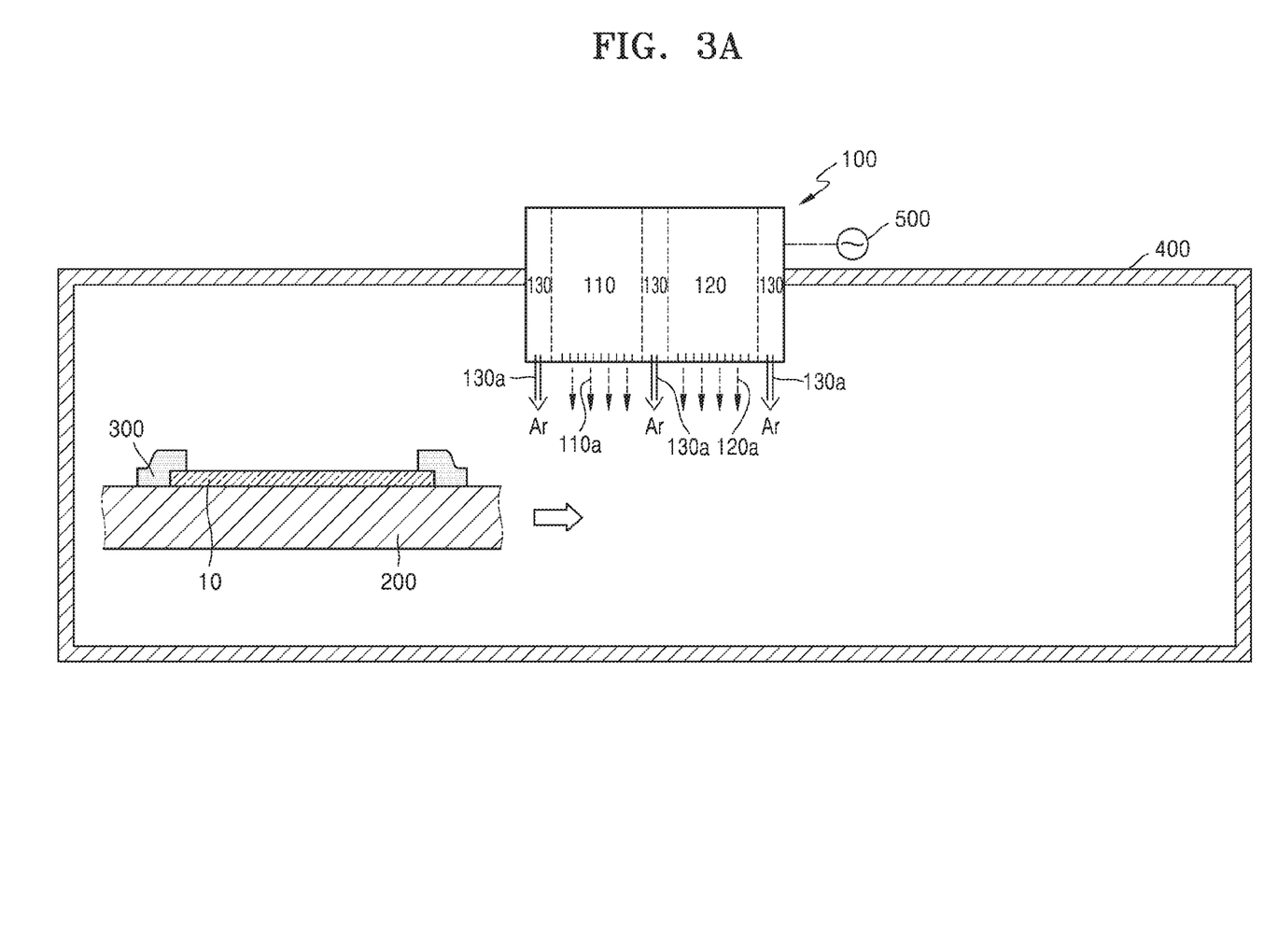
FIGS. 3A, 3B, 3C, and 3D are cross-sectional views showing a deposition process using the deposition apparatus shown in FIG. 1.

First, as illustrated in FIG. 3A, the substrate 10 and the mask 300 are placed on the susceptor 200 in the deposition chamber 400, the susceptor is moved to one side, and the entire deposition-target surface of the substrate 10 sequentially passes an area where the first process gas 110a is blown and an area where the second process gas 120a is blown.

Figure 3B:
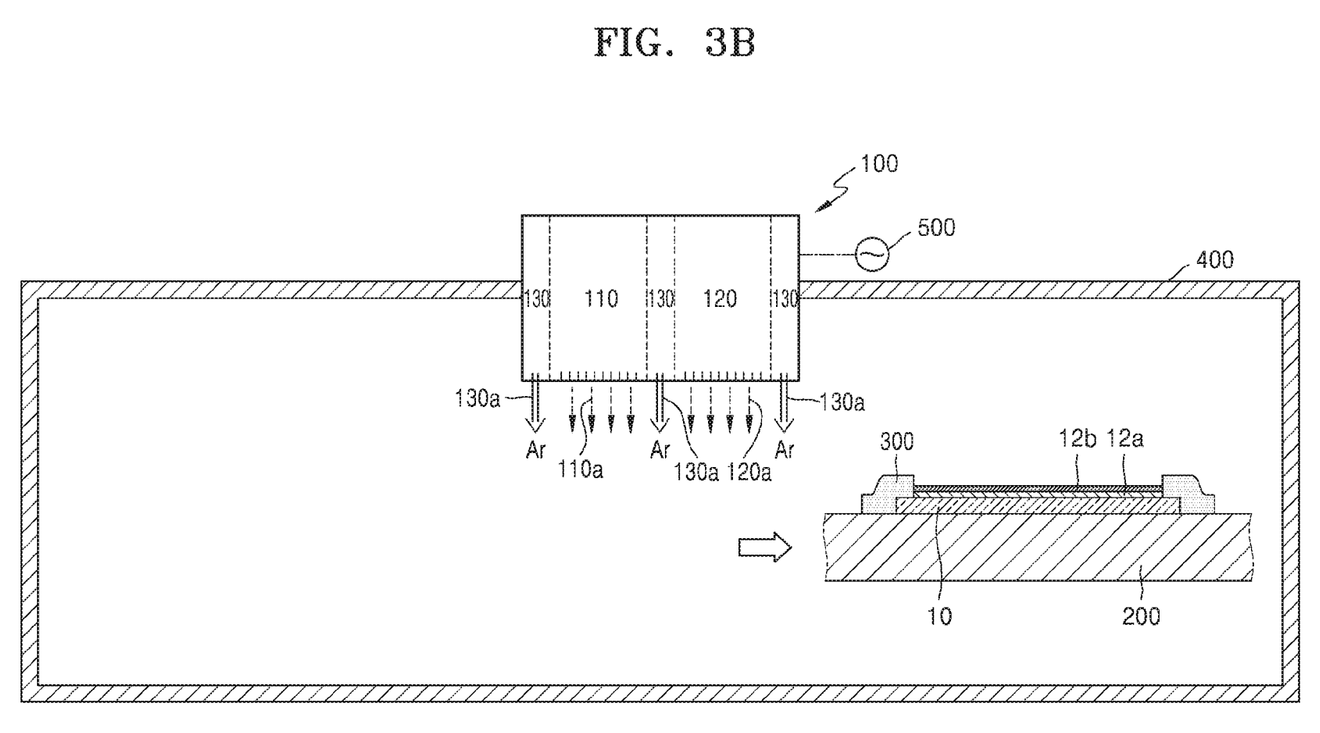
Figure 3C:
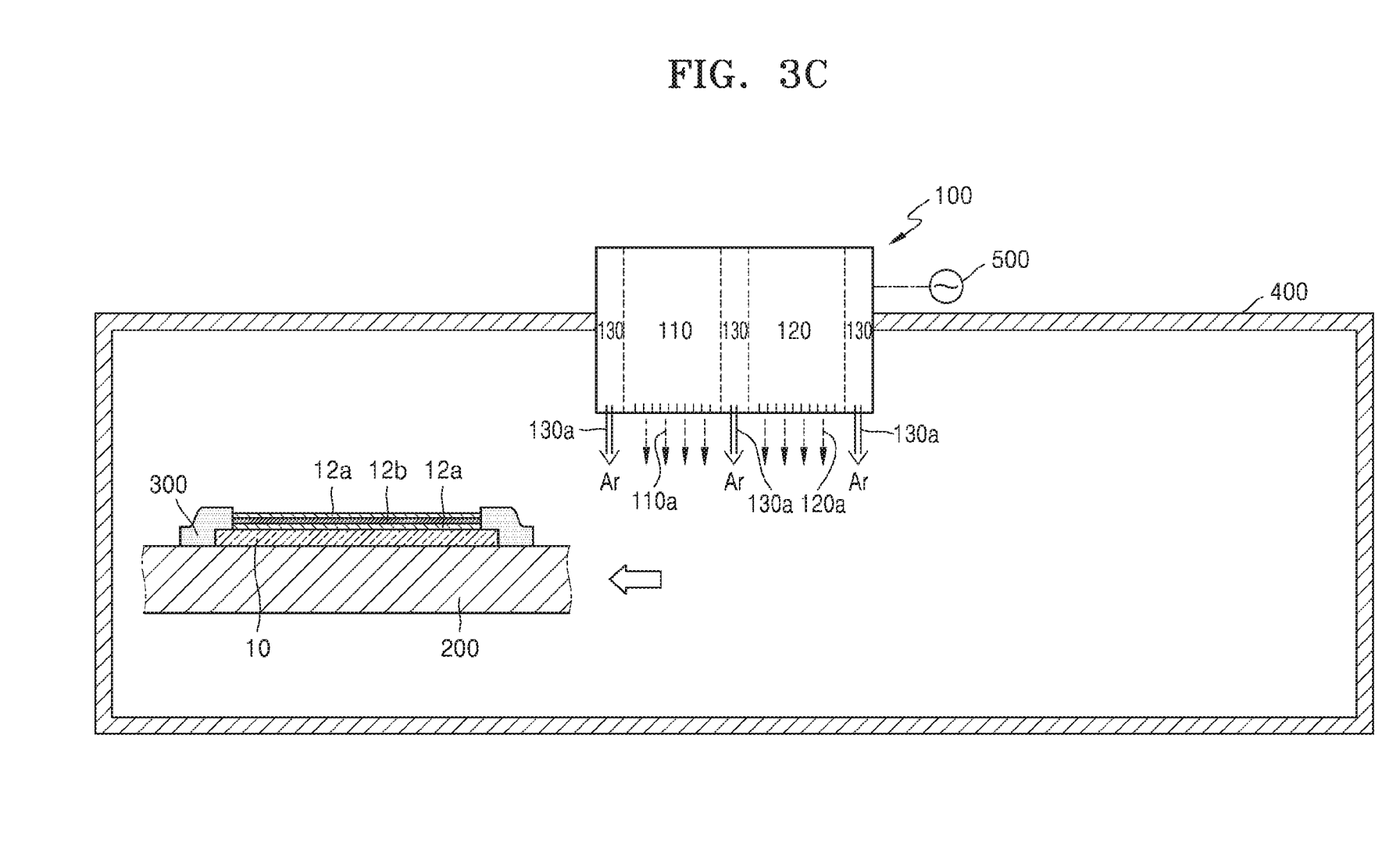
Figure 3D:
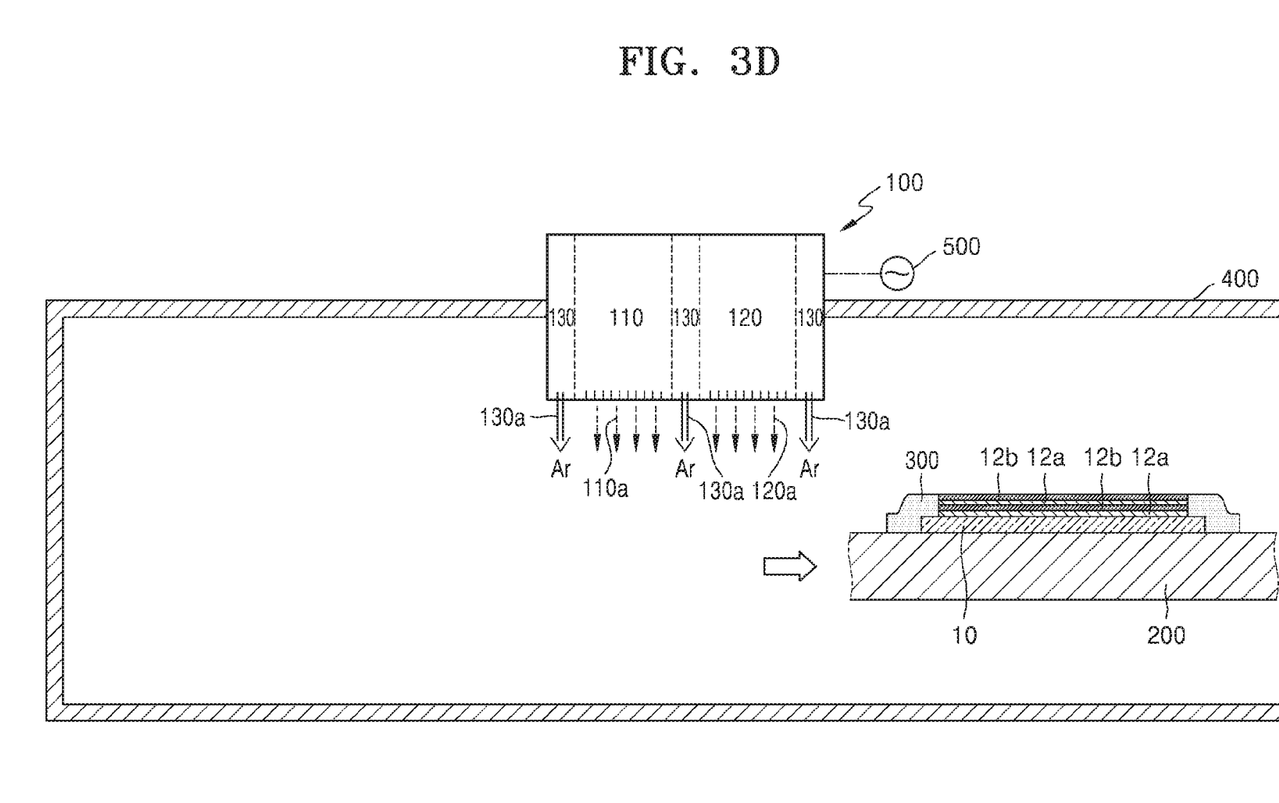

By doing so, as illustrated in FIG. 3B, a first thin film layer 12a made of the first process gas 110a and a second thin film layer 12b made of the second process gas 120a are sequentially formed in a way of deposition. For example, when the first process gas 110a is a mixture of $SiH_4+NH_3+N_2$ and the second process gas 120a is a mixture of $SiH_4+N_2O$, the first thin film layer 12a is a $SiN_X$ nitride film, and the second thin film layer 12b is a $SiO_X$ oxide film. That is, taking the thin film encapsulation layers 12 as an example, the thin film encapsulation layers 12 are formed by piling up different kinds of inorganic layers. In this case, the thin film encapsulation layers 12 are not classified into nitride films and oxide films to be deposited in several deposition chambers or deposited while changing the process gas in one same deposition chamber 400, but are deposited by one same process in one same deposition chamber 400. When each of the first thin film layer 12a and the second thin film layer 12b is formed to be plural in number, instead of only one each, as illustrated in FIGS. 3C and 3D, deposition is repeated while having the susceptor 200 perform a reciprocating motion to the left and the right. By doing so, the thin film layers are piled up in an order of the first thin film layer 12a—the second thin film layer 12b—the second thin film layer 12b—the first thin film layer 12a—the first thin film layer 12a—the second thin film layer 12b, and formed into a multilayer stack.

Accordingly, by using the aforementioned method, the different kinds of process gases 110a and 120a are provided in one same process in the same deposition chamber 400, and a plurality of thin film layers are efficiently and promptly formed.

In the exemplary embodiment described above, the first thin film layer 12a and the second thin film layer 12b are formed into different kinds of inorganic layers, but the first process gas 110a and the second process gas 120a may also be formed into inorganic layers and organic layers. That is, when the first process gas 110a is a mixture to form inorganic layers such as $SiN_X$ or $SiO_X$ and the second process gas 120a is a mixture of Hexamethyldisiloxane and $N_2O$ to form organic layers, the first thin film layer 12a is an inorganic layer of a nitride film or an oxide film, and the second thin film layer 12b is an organic layer. In other words, taking the thin film encapsulation layers 12 as an example, the thin film encapsulation layers 12 are formed by alternatively piling up inorganic layers and organic layers. In this case, the thin film encapsulation layers 12 are not deposited after being classified into the inorganic layers and the organic layers in several deposition chambers or deposited by changing process gas in one same process chamber, but are deposited by one same process in one same deposition chamber 400.

The first process gas 110a and the second process gas 120a may also be used in the ALD process. That is, when the first process gas 110a is an atomic layer reaction source absorbed by the substrate 10 and the second process gas 120a is atomic reaction gas causing a film-forming reaction with the absorbed atomic reaction source, an atomic layer is formed due to simultaneous supply of the reaction source and the reaction gas. In this case, extra reaction source may be overlaid on and absorbed by an atomic layer formed by the film-forming reaction, and the inert gas 130a also blows and purges the overlaid and absorbed extra reaction source.

As another example, the first process gas 110a and the second process gas 120a may be used for surface reforming. That is, the first process gas 110a is a source to form a film on the substrate 10, and the second process gas 120a includes surface treatment gas such as $H_2$, Ar, $O_2$, $N_2$, or the like for reforming a surface of a thin film made of the first process gas 110a. By doing so, a certain thin film layer is formed on the substrate 10 due to the first process gas 110a, and the second process gas 120a makes materials, which are absorbed by the thin film layer without occurring reactions with the thin film layer, additionally occur reactions with the thin film layer, or blows up the materials.

As described above, by using the aforementioned deposition apparatus, various deposition processes may be effectively and promptly performed while simultaneously supplying different kinds of process gases.

Therefore, by using the aforementioned deposition apparatus and the deposition method using the same, different kinds of thin films may be deposited by one same process in one same chamber without inserting and taking the substrate into and out of the chamber. Accordingly, production rate may be highly improved, and as the substrate does not need to be moved, danger of breakage may also be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of deposition, the method comprising:

preparing, in a deposition chamber, a gas supply unit comprising a first process gas supply unit blowing a first process gas onto a deposition-target surface of a substrate through an opening in a mask, a second process gas supply unit blowing a second process gas different from the first process gas onto the deposition-target surface of the substrate through the opening in the mask, and air curtain units blocking an area, between an area where the first process gas is blown and an area where the second process gas is blown, by blowing an inert gas;

maintaining a distance between the gas supply unit and the deposition-target surface of the substrate mounted on a susceptor within a range of greater than 2.0 mm and equal to or less than 4.0 mm;

forming a thin film layer made of the first process gas and a thin film layer made of the second process gas on the deposition-target surface of the substrate, by blowing the first process gas and the second process gas toward the substrate; and moving the susceptor, while the first process gas and the second process gas are being blown, in a reciprocating motion, the reciprocating motion moving the susceptor from a first area of the deposition chamber on a first side of the gas supply unit to a second area of the deposition chamber on a second side of the gas supply unit and from the second area back to the first area, wherein the gas supply unit simultaneously supplies the first process gas and the second process gas different from the first process gas such that different types of thin film layers are formed in one same process without mixing of the first and second process gases, wherein each of the different types of thin film layers includes a single thin film layer and is stacked in a vertical direction of the substrate, wherein the deposition chamber comprises extra areas sufficient for the deposition target surface of the substrate to pass an entire area comprising the first process gas supply unit and the second process gas supply unit, wherein the first process gas comprises a mixture for forming a nitride film on the deposition-target surface of the substrate; and wherein the second process gas comprises a mixture for forming an oxide film on the deposition-target surface of the substrate.

2. The method of claim 1, further comprising:

forming a circulation path for the first process gas between the deposition-target surface of the substrate and the first process gas supply unit, by withdrawing the first process gas to a first exhaust unit provided in the gas supply unit; and forming a circulation path for the second process gas between the deposition-target surface of the substrate and the second process gas unit, by withdrawing the second process gas to a second exhaust unit provided in the gas supply unit.

3. The method of claim 1, wherein, when the substrate is moved by the susceptor in the reciprocating motion, the deposition-target surface of the substrate passes under the entire area comprising the first process gas supply unit and the second process gas supply unit.

* * * * *